(12) United States Patent
Zhang et al.

(10) Patent No.: US 8,949,702 B2
(45) Date of Patent: Feb. 3, 2015

(54) SYSTEMS AND METHODS FOR DETECTOR SIDE TRAPPING SET MITIGATION

(75) Inventors: Fan Zhang, Milpitas, CA (US); Jun Xiao, Fremont, CA (US); Ming Jin, Fremont, CA (US)

(73) Assignee: LSI Corporation, San Jose, CA (US)

( * ) Notice: Subject to any disclaimer, the term of this patent is extended or adjusted under 35 U.S.C. 154(b) by 53 days.

(21) Appl. No.: 13/619,907

(22) Filed: Sep. 14, 2012

(65) Prior Publication Data

US 2014/0082461 A1    Mar. 20, 2014

(51) Int. Cl.
    *G06F 11/07*    (2006.01)
(52) U.S. Cl.
    USPC ............... 714/799; 714/E11.024; 714/752; 714/E11.032; 714/780; 714/755
(58) Field of Classification Search
    USPC .......... 714/799, 752, E11.032, 780, E11.024, 714/755
    See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |

(Continued)

OTHER PUBLICATIONS

U.S. Appl. No. 13/426,714, Shaohua Yang.

(Continued)

*Primary Examiner* — Albert Decady
*Assistant Examiner* — Kyle Vallecillo
(74) *Attorney, Agent, or Firm* — Hamilton DeSanctis & Cha

(57) ABSTRACT

Embodiments of the inventions are related to systems and methods for data processing, and more particularly to systems and methods for mitigating trapping sets in a data processing system.

21 Claims, 6 Drawing Sheets

(56) References Cited

U.S. PATENT DOCUMENTS

| | | | |
|---|---|---|---|
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,245,098 B2* | 8/2012 | Han et al. | 714/752 |
| 8,261,171 B2 | 9/2012 | Annampedu | |
| 8,291,284 B2 | 10/2012 | Savin | |
| 8,295,001 B2 | 10/2012 | Liu | |
| 8,443,267 B2* | 5/2013 | Zhong et al. | 714/780 |
| 2001/0016114 A1* | 8/2001 | Van Gestel et al. | 386/125 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0150745 A1* | 6/2009 | Langner et al. | 714/752 |
| 2009/0185643 A1 | 7/2009 | Fitzpatrick | |
| 2010/0088575 A1* | 4/2010 | Sharon et al. | 714/763 |
| 2010/0241921 A1* | 9/2010 | Gunnam | 714/752 |
| 2010/0275096 A1* | 10/2010 | Zhong et al. | 714/758 |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |
| 2012/0317462 A1* | 12/2012 | Liu et al. | 714/780 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of Gf(2m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/239,683, filed Sep. 22, 2011, Changyou Xu, Unpublished.

U.S. Appl. No. 13/316,858, filed Dec. 12, 2011, Zongwang Li, Unpublished.

U.S. Appl. No. 13/316,741, filed Dec. 12, 2011, Yang Han, Unpublished.

U.S. Appl. No. 13/445,878, filed Apr. 12, 2012, Yu Liao, Unpublished.

U.S. Appl. No. 13/327,279, filed Dec. 15, 2011, Wei Feng, Unpublished.

U.S. Appl. No. 13/340,974, filed Dec. 30, 2011, Dan Liu, Unpublished.

U.S. Appl. No. 13/445,848, filed Apr. 12, 2012, Bruce Wilson, Unpublished.

U.S. Appl. No. 13/340,951, filed Dec. 30, 2011, Lei Chen, Unpublished.

U.S. Appl. No. 13/369,468, filed Feb. 9, 2012, Zongwang Li, Unpublished.

U.S. Appl. No. 13/269,852, filed Oct. 10, 2011, Haitao Xia, Unpublished.

U.S. Appl. No. 13/284,730, filed Oct. 28, 2011, Fan Zhang, Unpublished.

U.S. Appl. No. 13/295,150, filed Nov. 14, 2011, Zongwang Li, Unpublished.

U.S. Appl. No. 13/284,767, filed Oct. 28, 2011, Fan Zhang, Unpublished.

U.S. Appl. No. 13/362,409, filed Jan. 31, 2012, Fan Zhang, Unpublished.

U.S. Appl. No. 13/227,544, filed Sep. 8, 2011, Shaohua Yang, Unpublished.

U.S. Appl. No. 13/283,549, filed Oct. 27, 2011, Wu Chang, Unpublished.

(56) References Cited

OTHER PUBLICATIONS

U.S. Appl. No. 13/186,234, filed Jul. 19, 2011, Haitao Xia, Unpublished.
U.S. Appl. No. 13/213,751, filed Aug. 19, 2011, Fan Zhang, Unpublished.
U.S. Appl. No. 13/174,453, filed Jun. 30, 2011, Johnson Yen, Unpublished.
U.S. Appl. No. 13/174,537, filed Jun. 30, 2011, Anantha Raman Krishnan, Unpublished.
U.S. Appl. No. 13/296,022, filed Nov. 14, 2011, Victor Krachkovsky, Unpublished.
U.S. Appl. No. 13/305,551, filed Nov. 28, 2011, Yang Han, Unpublished.
U.S. Appl. No. 13/227,416, filed Sep. 7, 2011, Lei Chen, Unpublished.
U.S. Appl. No. 13/305,510, filed Nov. 28, 2011, Lei Chen, Unpublished.
U.S. Appl. No. 13/302,119, filed Nov. 22, 2011, Lei Chen, Unpublished.
U.S. Appl. No. 13/597,026, filed Aug. 28, 2012, Fan Zhang, Unpublished.
U.S. Appl. No. 13/300,078, filed Nov. 18, 2011, Chung-Li Wang, Unpublished.
U.S. Appl. No. 13/180,495, filed Jul. 11, 2011, Chung-Li Wang, Unpublished.
U.S. Appl. No. 13/269,832, filed Oct. 10, 2011, Haitao Xia, Unpublished.
U.S. Appl. No. 13/415,326, filed Mar. 8, 2012, Shaohua Yang, Unpublished.
U.S. Appl. No. 13/426,693, filed Mar. 22, 2012, Shaohua Yang, Unpublished.
U.S. Appl. No. 13/483,105, filed May 30, 2012, Xuebin Wu, Unpublished.
U.S. Appl. No. 13/596,978, filed Aug. 28, 2012, Fan Zhang, Unpublished.
U.S. Appl. No. 13/483,100, filed May 30, 2012, Fan Zhang, Unpublished.
U.S. Appl. No. 13/412,520, filed Mar. 5, 2012, Fan Zhang, Unpublished.
U.S. Appl. No. 13/415,430, filed Mar. 8, 2012, Nayak Ratnakar Aravind, Unpublished.
U.S. Appl. No. 13/113,219, filed May 23, 2011, Yang Han, Unpublished.
U.S. Appl. No. 13/597,001, filed Aug. 28, 2012, Fan Zhang, Unpublished.
U.S. Appl. No. 13/596,947, filed Aug. 28, 2012, Fan Zhang, Unpublished.
U.S. Appl. No. 13/596,819, filed Aug. 28, 2012, Shaohua Yang, Unpublished.
U.S. Appl. No. 13/545,833, filed Jul. 10, 2012, Zhi Bin Li, Unpublished.
U.S. Appl. No. 13/433,693, filed Mar. 29, 2012, Fan Zhang, Unpublished.
U.S. Appl. No. 13/474,660, filed May 17, 2012, Zongwang Li, Unpublished.
U.S. Appl. No. 13/422,986, filed Mar. 16, 2012, Fan Zhang, Unpublished.
U.S. Appl. No. 13/372,580, filed Feb. 14, 2012, Fan Zhang, Unpublished.
U.S. Appl. No. 13/426,714, filed Mar. 22, 2012, Shaohua Yang, Unpublished.
U.S. Appl. No. 13/171,615, filed Jun. 29, 2011, Bradley D. Seago, Unpublished.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

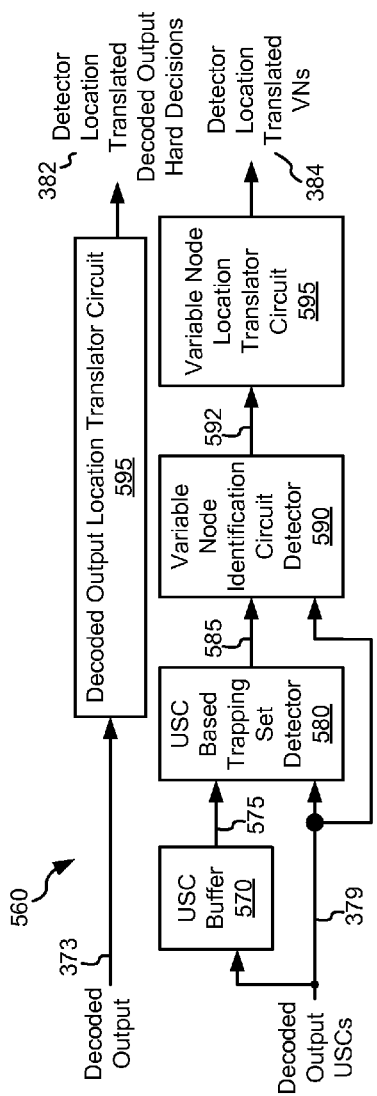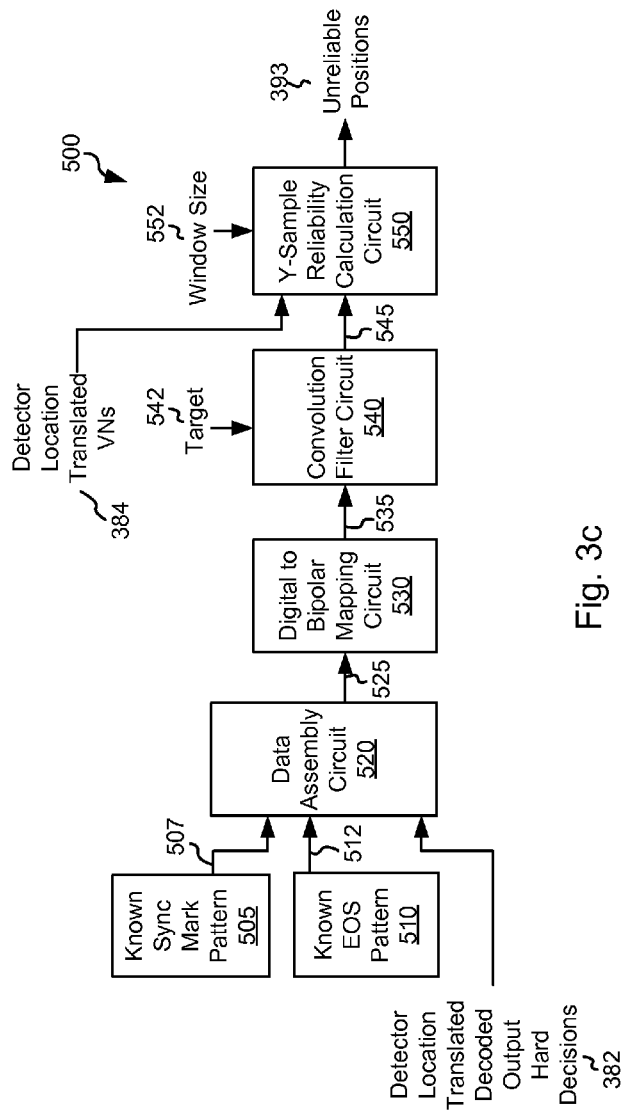
Fig. 3b
Fig. 3c

SYSTEMS AND METHODS FOR DETECTOR SIDE TRAPPING SET MITIGATION

BACKGROUND

Embodiments of the inventions are related to systems and methods for data processing, and more particularly to systems and methods for mitigating trapping sets in a data processing system.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Depending upon a number of factors, different data sets may become trapped where the same incorrect output results after each pass through the data detector circuit and/or the data decoder circuit. This trapping results in a failure to converge on the originally written data set.

Hence, for at least the aforementioned reasons, there exists a need in the art for advanced systems and methods for data processing.

BRIEF SUMMARY

Embodiments of the inventions are related to systems and methods for data processing, and more particularly to systems and methods for mitigating trapping sets in a data processing system.

Various embodiments of the present invention provide data processing systems that include: a data detector circuit, a data decoder circuit, a potential trapping set detection circuit, and a data instance modification circuit. The data detector circuit is operable to apply a data detection algorithm to a data input to yield a first detected output. The data decoder circuit is operable to apply a data decoding algorithm to a decoder input to yield a decoded output. The decoder input is derived from the first detected output. The potential trapping set detection circuit is operable to identify a potential trapping set based at least in part on the decoded output, and the data instance modification circuit is operable to scale at least one selected element of the data input to yield a detector input based at least in part on identification of the potential trapping set. The data detector circuit is further operable to apply the data detection algorithm to the detector input to yield a second detected output This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS OF THE INVENTION

Figure 1:
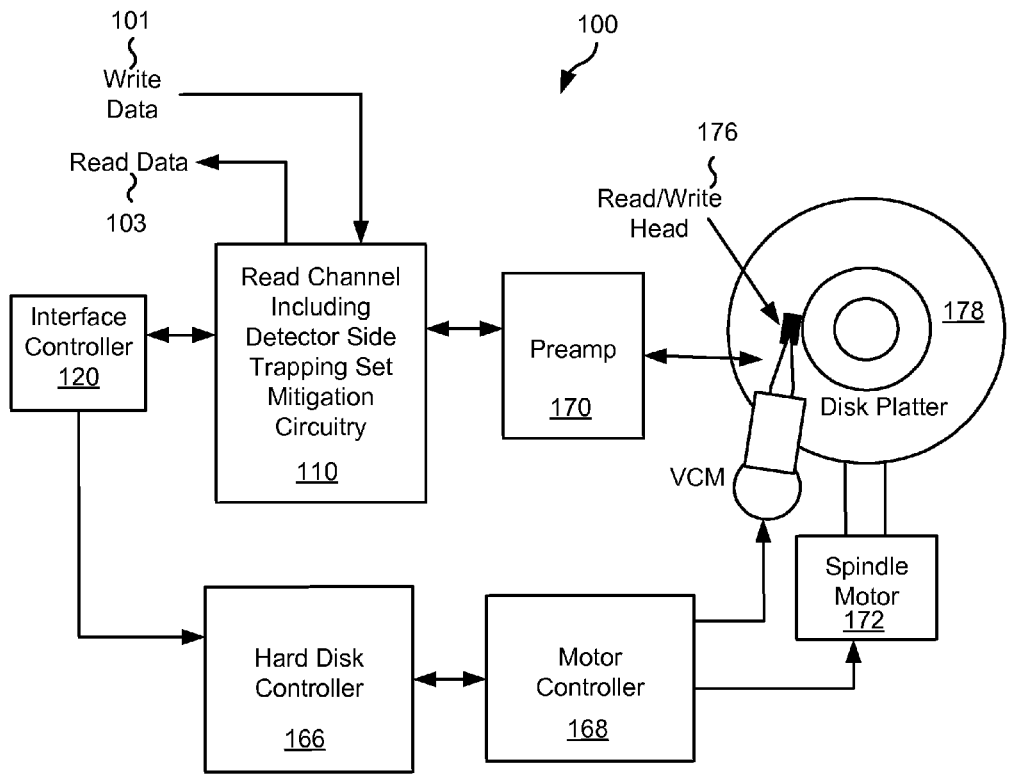
FIG. 1 shows a storage system including detector side trapping set mitigation circuitry in accordance with various embodiments of the present invention.

Embodiments of the inventions are related to systems and methods for data processing, and more particularly to systems and methods for mitigating trapping sets in a data processing system.

Various embodiments of the present inventions provide data processing systems that include: a data detector circuit, a data decoder circuit, a potential trapping set detection circuit, and a data instance modification circuit. The data detector circuit is operable to apply a data detection algorithm to a data input to yield a first detected output. The data decoder circuit is operable to apply a data decoding algorithm to a decoder input to yield a decoded output. The decoder input is derived from the first detected output. The potential trapping set detection circuit is operable to identify a potential trapping set based at least in part on the decoded output, and the data instance modification circuit is operable to scale at least one selected element of the data input to yield a detector input based at least in part on identification of the potential trapping set. The data detector circuit is further operable to apply the data detection algorithm to the detector input to yield a second detected output.

In some instances of the aforementioned embodiments, the decoded output is a first decoded output, and wherein the data decoder circuit is further operable to re-apply the data decoding algorithm to the decoder input guided by the first decoded output to yield a second decoded output. The potential trapping set detection circuit is further operable to identify a potential trapping set based at least in part on the first decoded output and the second decoded output. In some cases, the first decoded output exhibits a first set of unsatisfied checks and the second decoded output exhibits a second set of unsatisfied checks, and the potential trapping set is identified where at least the first set of unsatisfied checks matches the second set of unsatisfied checks are identical. In a particular case, the first set of unsatisfied checks and the second set of unsatisfied checks each include fewer than five unsatisfied checks.

In other instances of the aforementioned embodiments, the data processing system further includes: a variable node calculation circuit, and a location translation circuit. The variable node calculation circuit is operable to identify one or more variable nodes associated with each of the unsatisfied checks. The location translation circuit is operable to determine the location of the identified variable nodes from the decoder domain to the detector domain to yield a location set. The data processing system further includes an unreliable location identification circuit operable to determine a defined number of the elements of the data input identified by the location set exhibiting the lowest reliability. In some cases, determining the at least one selected element of the data input identified by the location set exhibiting the lowest reliability includes calculating a reliability value for each element of the data input identified by the location set and selecting the defined number of the calculated reliability values that are the lowest.

Turning to FIG. 1, a storage system 100 including a read channel circuit 110 having conditional positive feedback decoding circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller 190 that includes out of order constraint command circuitry. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 applies a data detection algorithm by a data detector circuit to the received data set to yield a detected output. The detected output is provided to a data decoder circuit that applies a data decoding algorithm to yield a decoded output. This decoded output may be fed back to data detector circuit where it guides re-application of the data detection algorithm. This iterative process may continue until either a timeout condition is achieved, until the original data is recovered, or until a trapping set is identified. Where a trapping set is identified, detector side trapping set mitigation is applied in an attempt to sidestep the trapping set. In some cases, the read channel circuit may be implemented similar to that discussed in relation to FIGS. 3a-3c; and/or may operate similar to the methods discussed below in relation to FIGS. 4a-4c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
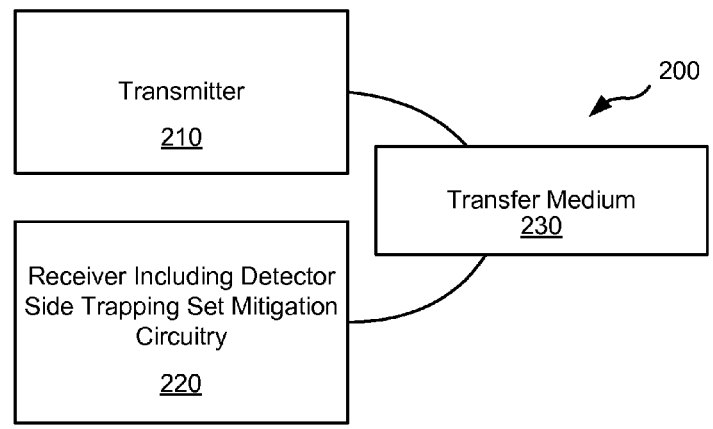
FIG. 2 depicts a data transmission system including detector side trapping set mitigation circuitry in accordance with one or more embodiments of the present invention.

Turning to FIG. 2, a data transmission system 200 including a receiver 220 having conditional positive feedback decoding circuitry is shown in accordance with various embodiments of the present invention. Data transmission system 200 includes a transmitter 210 that is operable to transmit encoded information via a transfer medium 230 as is known in the art. The encoded data is received from transfer medium 230 by a receiver 220. Receiver 220 processes the received input to yield the originally transmitted data.

As part of processing the received information, receiver 220 applies a data detection algorithm by a data detector circuit to the received data set to yield a detected output. The detected output is provided to a data decoder circuit that applies a data decoding algorithm to yield a decoded output. This decoded output may be fed back to data detector circuit where it guides re-application of the data detection algorithm. This iterative process may continue until either a timeout condition is achieved, until the original data is recovered, or until a trapping set is identified. Where a trapping set is identified, detector side trapping set mitigation is applied in an attempt to sidestep the trapping set. In some cases, the read channel circuit may be implemented similar to that discussed in relation to FIGS. 3a-3c; and/or may operate similar to the methods discussed below in relation to FIGS. 4a-4c.

Figure 3A:
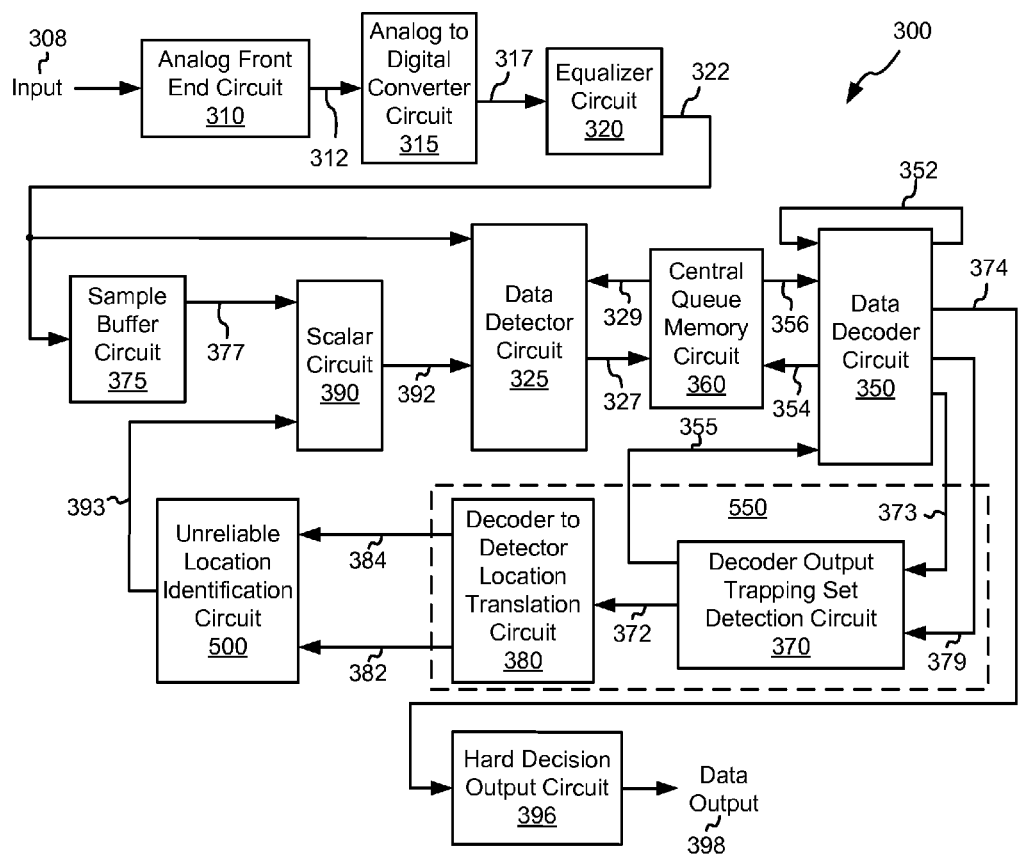
FIG. 3$a$-3$c$ shows a data processing circuit including detector side trapping set mitigation circuitry in accordance with some embodiments of the present invention.

FIG. 3a shows a data processing circuit 300 a data decoder circuit with conditional positive feedback circuitry in accordance with some embodiments of the present invention. Data processing circuit 300 includes an analog front end circuit 310 that receives an analog signal 308. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input signal 308 is derived from a read/write head assembly (not shown) that is disposed in relation to a storage medium (not shown). In other cases, analog input signal 308 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input signal 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art. It may be possible that equalized output 322 may be received directly from a storage device in, for example, a solid state storage system. In such cases, analog front end circuit 310, analog to digital converter circuit 315 and equalizer circuit 320 may be eliminated where the data is received as a digital data input. Equalized output 322 is stored to a sample buffer circuit 375 that includes sufficient memory to maintain one or more codewords until processing of that codeword is completed through a data detector circuit 325 and a data decoder circuit 350 including, where warranted, multiple "global iterations" defined as passes through both data detector circuit 325 and data decoder circuit 350 and/or "local iterations" defined as passes through data decoding circuit 350 during a given global iteration. Sample buffer circuit 375 stores the received data as buffered data 377.

Buffered data 377 is provided to a scalar circuit 390 that is operable to scale selected instances of buffered data 377 by a factor less than unity. In one particular embodiment of the present invention, scalar circuit 390 is operable to multiply selected instances of buffered data by a scaling factor that is less than unity (i.e., less than '1'), and to leave other instances of buffered data 377 unscaled. The combination of the scaled instances and unscaled instances are provided as a scalar output 392 to data detector circuit 325. The scaling is selectively applied to instance locations identified by a unreliable positions 393 that is more fully described below. In particular, any instances identified by unreliable positions 393 are multiplied by the scaling factor, and other instances are not scaled. Data detector circuit 325 applies a data detection algorithm to equalized output 322 on a first global iteration for equalized output, and to scalar output 392 for the second and later global iterations of an equalized output 322.

Data detector circuit 325 may be any data detector circuit known in the art that is capable of producing a detected output 327. As some examples, data detector circuit 325 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 325 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. When data decoder circuit 350 is available, data decoder circuit 350 receives detected output 327 from central queue memory 360 as a decoder input 356. Data decoder circuit 350 applies a data decoding algorithm to decoder input 356 in an attempt to recover originally written data. Application of the data decoding algorithm includes passing messages between variable and check nodes as is known in the art. In most cases, the message passing includes standard belief propagation or feed forward messaging where two or more messages feeding the variable or check node are used to calculate or determine a message to be passed to another node.

The result of the data decoding algorithm is provided as a decoded output 354. Similar to detected output 327, decoded output 354 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs (exceeding of a defined number of local iterations through data decoder circuit 350 and global iterations for the currently processing equalized output), data decoder circuit 350 provides the result of the data decoding algorithm as a data output 374. Data output 374 is provided to a hard decision output circuit 396 where the data is reordered before providing a series of ordered data sets as a data output 398.

One or more iterations through the combination of data detector circuit 325 and data decoder circuit 350 may be made in an effort to converge on the originally written data set. As mentioned above, processing through both the data detector circuit and the data decoder circuit is referred to as a "global iteration". For the first global iteration, data detector circuit 325 applies the data detection algorithm without guidance from a decoded output. For subsequent global iterations, data detector circuit 325 applies the data detection algorithm to buffered data 377 as guided by decoded output 354. Decoded output 354 is received from central queue memory 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from a decoded output 352. For subsequent local iterations, data decoder circuit 350 applies the data decoding algorithm to decoder input 356 as guided by a previous decoded output 352. In some embodiments of the present invention, a default of ten local iterations is allowed for each global iteration.

During the local iterations of the data decoding algorithm to the currently processing decoder input 356, the possibility of a trapping set is monitored. In particular, at the end of each local iteration, a decoded output 373 (a copy of decoded output 352) and decoded output USCs 379 (i.e., an identification of all unsatisfied check (USCs) corresponding to decoded output 373) are provided to a trapping set detection and location circuit 560. Trapping set detection and location circuit 560 includes a trapping set detection circuit 370 that is operable to detect a possible trapping set. A possible trapping set is identified when the number of unsatisfied checks (reported as decoded output USCs 379) remaining after a given local iteration is less than a defined threshold, and the same unsatisfied checks are reported at the end of a defined number of local iterations. As an example, a potential trapping set may be identified where the number of remaining unsatisfied checks is five (5) or less, and the same set of unsatisfied checks have been reported at the end of three consecutive local iterations of data decoder circuit 350.

Where a potential trapping set is identified by trapping set detection circuit 370, a decoder stop 355 is asserted causing data decoder circuit 350 to stop applying local iterations to decoder input 356. In addition, decoded output USCs 379 are passed as USCs 372 to a decoder to detector location translation circuit 380. Decoder to detector location translation circuit 380 identifies all variable nodes (VNs) associated with each of the unsatisifed check reported as USCs 372. The location of the VNs are then translated from the decoder domain to the detector domain. The data presented to data decoder circuit 350 may be interleaved or shuffled in comparison to the data provided to data detector circuit 325. The aforementioned location translation operates to identify the location in the scalar output 392 that corresponds to the identified VNs. This location information is provided as a detector location translated VNs 384 to an unreliable location identification circuit 500. In addition, decoder to detector location translation circuit 380 translates the hard decisions from decoded output 373 to the locations in the detector domain using the same de-interleaving (i.e., un-shuffling). The translated result is provided as detector location translated decoded output hard decisions 382.

An example implementation of trapping set detection and location circuit 560 is shown in FIG. 3b. As shown, trapping set detection and location circuit 560 includes a decoded output translator circuit 595 that operates to de-interleave decoded output 373 to yield the decoded output in the locations corresponding to those in scalar output 392. This de-interleaving is similar to that applied when transferring decoded output 354 to data detector circuit 325 as detector input 329. The translated result is provided as detector location translated decoded output hard decisions 382.

In addition, trapping set detection and location circuit 560 includes trapping set detection circuitry including a USC buffer 570 operable to include multiple sets of USCs 575 received as decoded output USCs 379, and a USC based trapping set detector 580 operable to compare preceding sets of USCs 575 against the currently received decoded output USCs 379. In one particular embodiment of the present invention, USC based trapping set detector 580 is operable to assert a potential trapping set indicator 585 whenever decoded output USCs 379 are identical to two preceding sets of USCs 575. Of note, decoder stop is asserted coincident with potential trapping set indicator 585. Whenever potential trapping set indicator 585 is asserted, a variable node identification circuit 590 identifies VNs associated with each of the respective USCs received as decoded output USCs 379, and provides an identification of the VNs as a VN identifier output 592 to a variable node location translator circuit 597. Variable node location translator circuit operates to apply the same de-interleaving applied by decoded output location transfer circuit 595 to yield the location of the VNs in the detector domain. This location information is provided as detector location translated VNs 384.

Referring again to FIG. 3a, unreliable location identification circuit 500 uses detector location translated VNs 384 and detector location translated decoded output hard decisions 382 to determine which instances of buffered data 377 are the least reliable. In turn, unreliable location identification circuit 500 calculates a reliability of each of the locations corresponding to a location translated VNs. From this reliability data, unreliable location identification circuit 500 selects a defined number of instances of buffered data 377 that are the least reliable for scaling by asserting unreliable positions 393 at the time the corresponding instances of buffered data 377 are being accessed from sample buffer circuit 375. In turn, scalar circuit 390 scales the identified instances to yield scalar output 392 that is presented to data detector circuit 325 as described above.

An example implementation of unreliable location identification circuit 500 is shown in FIG. 3c. As shown, unreliable location identification circuit 500 includes a data assembly circuit 520 that receives detector location translated output hard decisions 382 and appends a sync mark pattern 507 to the beginning of detector location translated output hard decisions 382 and appends an end of sync (EOS) pattern 512 to the end of location translated output hard decisions 382 to yield a proxy 525 of the original input. EOS pattern 512 is a known pattern that is pre-programmed in a known EOS pattern buffer 510, and sync mark pattern 507 is a known sync mark pattern that is pre-programmed in a known sync mark pattern buffer 505.

Proxy 525 is provided to a digital to bipolar mapping circuit 530 that converts the digital binary values (0, 1) included in proxy 525 into a corresponding series of bipolar values (−1, 1). In particular, the digital values of '0' are converted to '−1', and the digital values of '1' are maintained as '1'. The resulting bipolar value set 535 is provided to a convolution filter circuit 540. Convolution filter circuit 540 may be any convolution filter circuit known in the art that is capable of convolving bipolar value set 535 with a target 542 to yield a filtered output 545. Filtered output 545 is an estimate of the y-sample input available as buffered data 377.

Filtered output 545 is provided to a y-sample reliability calculation circuit 550 that is operable to calculate the reliability of each instance of filtered output 545 that correspond to the locations indicated by detector output location translated VNs 384. The reliability of each of the instances is calculated over a window of window size 552. Each of the calculated reliability values are then compared to determine a defined number of instances that exhibit the lowest reliability. In one particular embodiment of the present invention, the defined number of instances is two (2). Based upon the disclosure provided herein, one of ordinary skill in the art will recognize different numbers of instances that may be used in relation to different embodiments of the present invention. In one particular embodiment of the present invention, the unreliability data for filtered output 545 is calculated base upon the following equation:

$$\text{Reliability} = \sum_{i=t-w}^{t+w} [\text{Buffered Data } 377(i) - \text{Filtered Output } 545(i)]^2,$$

where t indicates a location received as detector output location translated VNs 384, and window size 552 is 2w+1. Y-sample reliability calculation circuit 550 in turn asserts unreliable positions output 393 y-sample reliability calculation circuit 550 corresponding to the identified unreliable positions. As discussed above, scaling is selectively applied based upon assertion of unreliable positions 393.

Figure 4A:
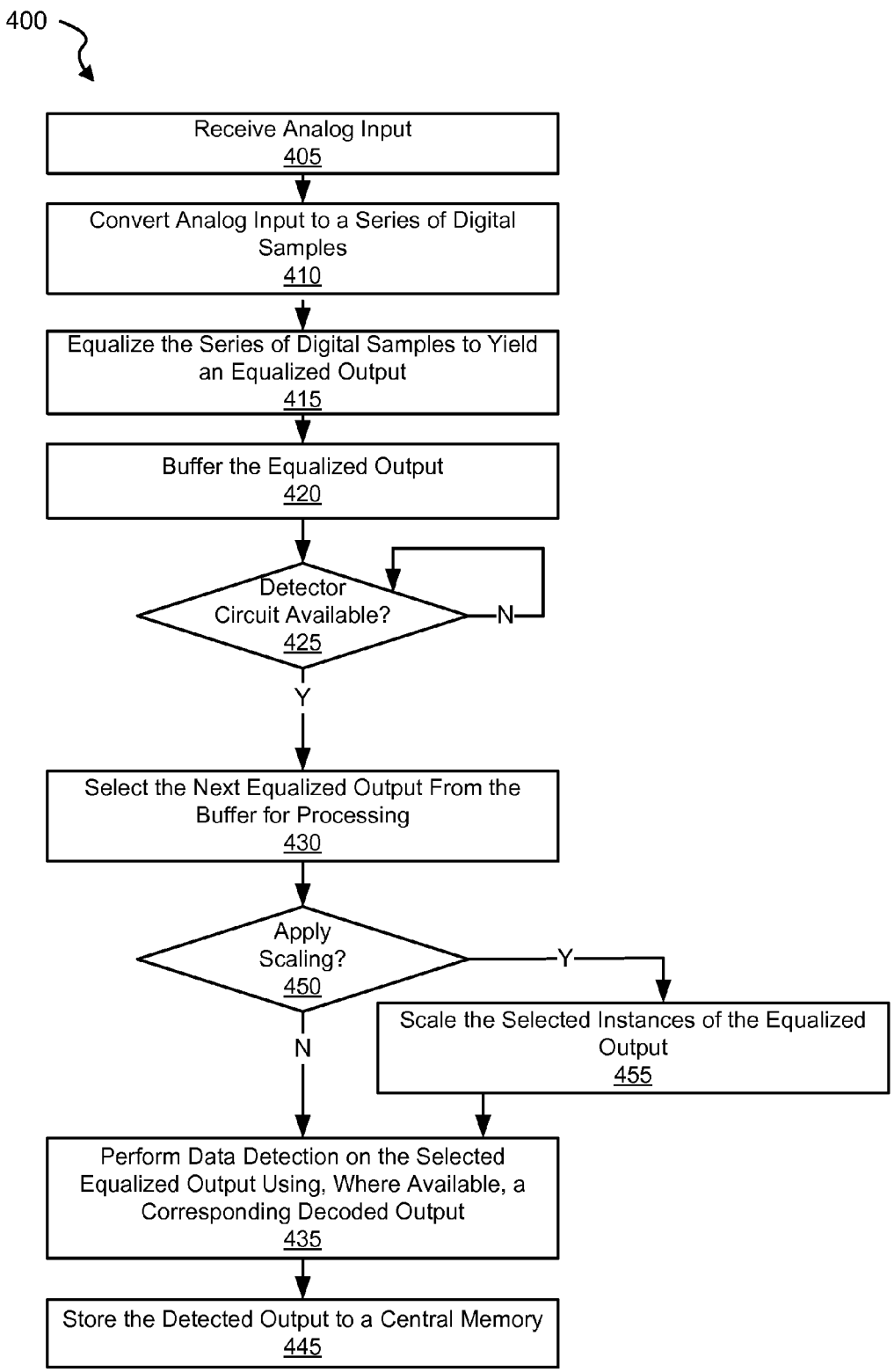
FIGS. 4$a$-4$c$ are flow diagrams showing a method for detector side trapping set mitigation in accordance with some embodiments of the present invention.
Figure 4B:
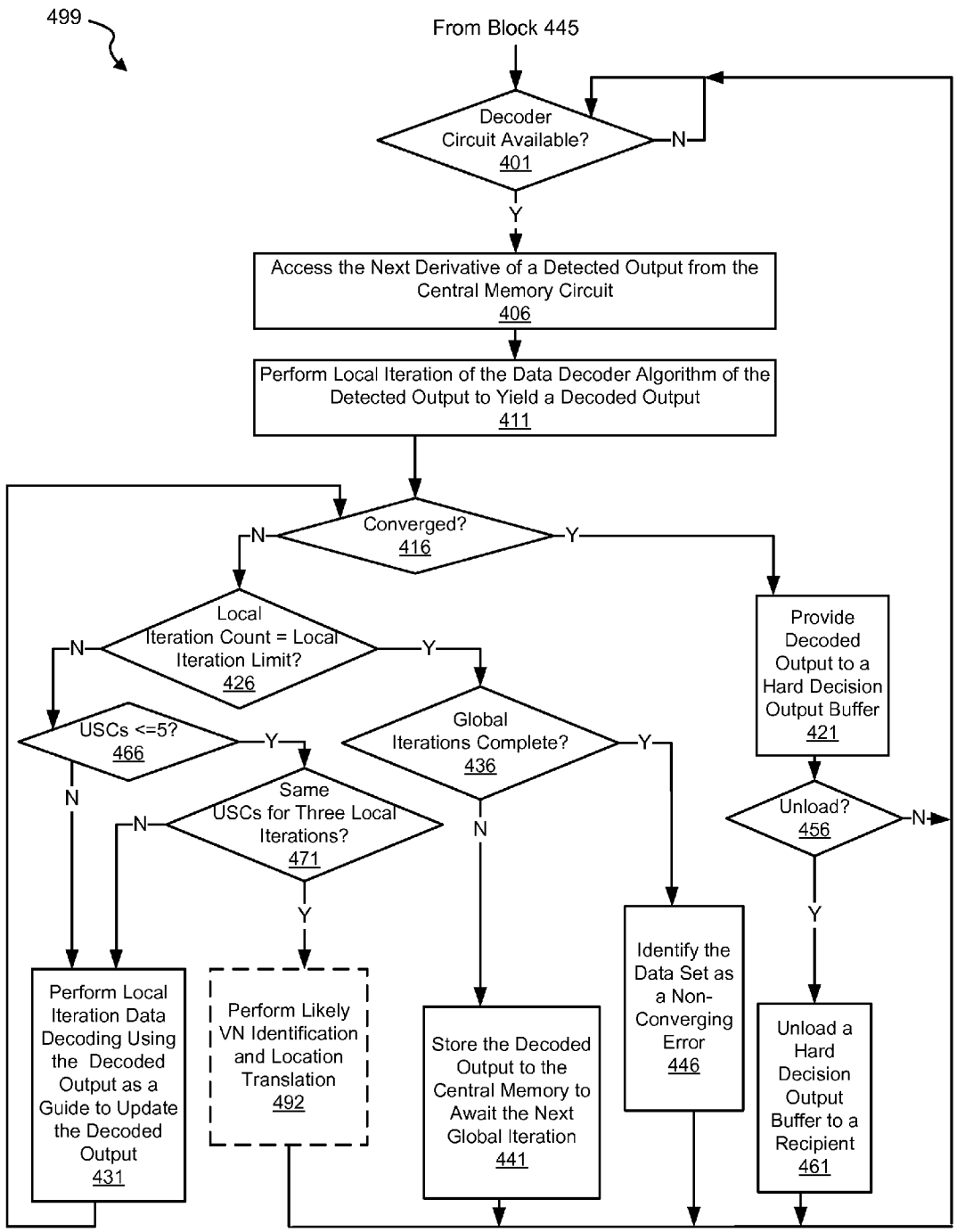
Figure 4C:
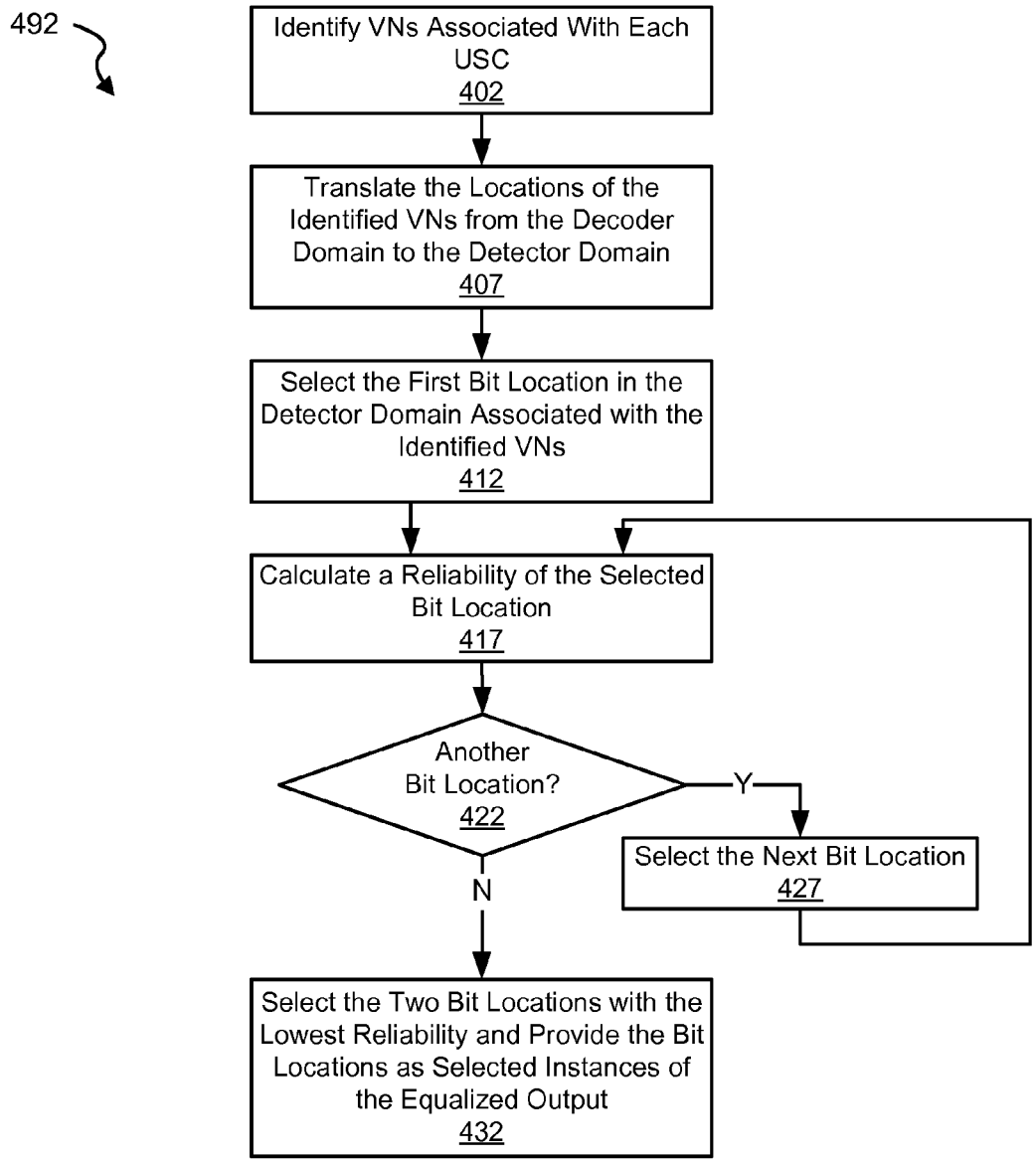

Turning to FIGS. 4a-4c are flow diagrams 400, 499, 492 showing a method for flow diagrams showing a method for detector side trapping set mitigation in accordance with some embodiments of the present invention. Following flow diagram 400 of FIG. 4a, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

It is determined whether a data detector circuit is available to process a data set (block 425). Where a data detector circuit is available to process a data set (block 425), the next equalized output from the buffer is accessed for processing (block 430). The data detector circuit may be, for example, a Viterbi algorithm data detector circuit or a maximum a posteriori data detector circuit. It is determined whether one or more instances of the selected equalized outputs is to be scaled in an effort to mitigate a potential trapping set (block 450). This may be done based upon a scaling input indicating the one or more instances to be scaled. Where scaling is to be performed (block 450), the one or more identified instances of equalized output are scaled (block 455). Then, a data detection algorithm is applied to the accessed equalized output (scaled or not) by the data detector circuit to yield a detected output (block 435). The detected output is stored to a central queue memory circuit where it awaits processing by a data decoder circuit (block 445).

Turning to FIG. 4b and following flow diagram 499, it is determined whether a data decoder circuit is available (block 401) in parallel to the previously described data detection process of FIG. 4a. The data decoder circuit may be, for example, a low density parity check data decoder circuit as are known in the art. Where the data decoder circuit is available (block 401) the next derivative of a detected output is selected from the central queue memory circuit (block 406). The derivative of the detected output may be, for example, an interleaved (shuffled) version of a detected output from the data detector circuit. A first local iteration of a data decoding algorithm is applied by the data decoder circuit to the selected detected output to yield a decoded output (block 411). It is then determined whether the decoded output converged (e.g., resulted in the originally written data as indicated by the lack of remaining unsatisfied checks) (block 416).

Where the decoded output converged (block 416), it is provided as a decoded output codeword to a hard decision output buffer (e.g., a re-ordering buffer) (block 421). It is determined whether the received output codeword is either sequential to a previously reported output codeword in which case reporting the currently received output codeword immediately would be in order, or that the currently received output codeword completes an ordered set of a number of codewords in which case reporting the completed, ordered set of codewords would be in order (block 456). Where the currently received output codeword is either sequential to a previously reported codeword or completes an ordered set of codewords (block 456), the currently received output codeword and, where applicable, other codewords forming an in order sequence of codewords are provided to a recipient as an output (block 461).

Alternatively, where the decoded output failed to converge (e.g., errors remain) (block 416), it is determined whether the number of local iterations already applied equals the maximum number of local iterations (block 426). In some cases, a default seven local iterations are allowed per each global iteration. Based upon the disclosure provided herein, one of ordinary skill in the art will recognize another default number of local iterations that may be used in relation to different embodiments of the present invention. Where another local iteration is allowed (block 426), it is determined whether a potential trapping set has occurred. In particular, it is determined whether the number of unsatisfied checks remaining in the decoded output is less than or equal to five (5) (block 466), and that the same unsatisfied checks remain after three consecutive local iterations (block 471). Where the number of unsatisfied checks remaining in the decoded output is less than or equal to five (5) (block 466) and the same unsatisfied checks remain after three consecutive local iterations (block 471), likely VN identification and location translation is performed and the decoding process is stopped (block 492). Block 492 is shown in dashed lines indicating that it is discussed in greater detail as part of FIG. 4c below. Alternatively, where either the number of unsatisfied checks remaining in the decoded output is not less than or equal to five (5) (block 466) or the same unsatisfied checks do not remain after three consecutive local iterations (block 471), the data decoding algorithm is applied to the selected data set using the decoded output as a guide to update the decoded output (block 431), and the processes of blocks starting at block 416 are repeated for the next local iteration.

Alternatively, where all of the local iterations have occurred (block 426), it is determined whether all of the global iterations have been applied to the currently processing data set (block 436). Where the number of global iterations has not completed (block 436), the decoded output is stored to the central queue memory circuit to await the next global iteration (block 441). Alternatively, where the number of global iterations has completed (block 436), an error is indicated and the data set is identified as non-converging (block 446).

Turning to flow diagram 492 of FIG. 4c, performance of likely VN identification and location translation is described. Likely VN identification and location translation is a process whereby VNs associated with the USCs remaining after completion of the most recent local iteration of the data decoding are first identified (block 402). This includes identifying all VNs associated with a given unsatisfied check. In addition, the location of the identified VNs are translated from the decoder domain to the detector domain (block 407). The same data is processed by both the data detector and the data decoder, however, the data is shuffled and unshuffled between processing by the data detector and data decoder. Translating the location of the VNs from the decoder domain to the detector domain includes accounting for the shuffling/unshuffling process thereby assuring that a location identified in the decoder domain as potentially problematic (i.e., the locations of the VNs associated with the remaining unsatisfied checks) correspond to the appropriate data positions in the detector domain.

A first bit or sample position corresponding to the locations of the identified VNs in the detector domain is selected (block 412), and a reliability of the selected bit or sample position is calculated (block 417). This calculation includes converting the digital binary values (0, 1) into a corresponding series of bipolar values (−1, 1). In particular, the digital values of '0' are converted to '−1', and the digital values of '1' are maintained as '1'. The resulting bipolar value set is provided to a convolution filter circuit. The convolution filter circuit may be any convolution filter circuit known in the art that is capable of convolving a bipolar value set with a target to yield a filtered output. The filtered output is an estimate of the y-sample input available as buffered data (from block 420).

The filtered output is provided is then used along with the buffered y-sample data to calculate a reliability value over a defined window size for the location in accordance with the following equation:

$$\text{Reliability} = \sum_{i=t-w}^{t+w} [\text{Buffered Data}(i) - \text{Filtered Output}(i)]^2,$$

where t indicates a location received as the detector domain location of the VNs, window size 552 is 2w+1, the buffered data is that available from block 420, and the filtered output is generated as part of the reliability calculation process described above.

It is then determined whether there is another instance of the buffered data corresponding to an identified VN that remains to be calculated (block 422). Where another reliability value remains to be calculated (block 422), the next bit or sample location is selected (block 427) and the processes of blocks 417-422 are repeated for the next location. Alternatively, where no additional reliability values remain to be calculated (block 422), the two bit or sample locations with the lowest reliability are provided as selected instances of the equalized output (block 432). The selected instances of the equalized output are scaled prior to a subsequent global iteration processing the data set at issue as described above in relation to blocks 450, 455.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data detector circuit operable to apply a data detection algorithm to a data input to yield a first detected output;
    a data decoder circuit operable to apply a data decoding algorithm to a decoder input to yield a decoded output, wherein the decoder input is derived from the first detected output;
    a potential trapping set detection circuit operable to identify a potential trapping set based at least in part on the decoded output;
    an unreliable location identification circuit operable to identify an unreliable location in the data input using a combination of the data input and a filtered version of the data input;
    a data instance modification circuit operable to:
        based at least in part on identification of the potential trapping set, scale at least one selected element of the data input corresponding to the unreliable location to yield a detector input; and
        leave at least another element of the data input unmodified; and
    wherein the data detector circuit is further operable to apply the data detection algorithm to the detector input to yield a second detected output.

2. The data processing system of claim 1, wherein the decoded output is a first decoded output, and wherein the data decoder circuit is further operable to re-apply the data decoding algorithm to the decoder input guided by the first decoded output to yield a second decoded output, and wherein the potential trapping set detection circuit is further operable to identify a potential trapping set based at least in part on the first decoded output and the second decoded output.

3. The data processing system of claim 2, wherein the first decoded output exhibits a first set of unsatisfied checks and the second decoded output exhibits a second set of unsatisfied checks, and wherein the potential trapping set is identified where at least the first set of unsatisfied checks matches the second set of unsatisfied checks are identical.

4. The data processing system of claim 3, wherein the first set of unsatisfied checks and the second set of unsatisfied checks each include fewer than five unsatisfied checks.

5. The data processing system of claim 1, wherein the data processing system further comprises:
a variable node calculation circuit operable to identify one or more variable nodes associated with each of the unsatisfied checks;
a location translation circuit operable to determine the location of the identified variable nodes from the decoder domain to the detector domain to yield a location set.

6. The data processing system of claim 5, wherein the data processing system further comprises:
an unreliable location identification circuit operable to determine a defined number of the elements of the data input identified by the location set exhibiting the lowest reliability.

7. The data processing system of claim 6, wherein determining the at least one selected element of the data input identified by the location set exhibiting the lowest reliability includes calculating a reliability value for each element of the data input identified by the location set and selecting the defined number of the calculated reliability values that are the lowest.

8. The data processing system of claim 1, wherein the data detector circuit is selected from a group consisting of: a maximum a posteriori data detector circuit, and a Viterbi algorithm data detector circuit.

9. The data processing system of claim 1, wherein the data decoder circuit is a low density data decoder circuit.

10. The data processing system of claim 1, wherein the system is implemented as an integrated circuit.

11. The data processing system of claim 1, wherein the system is implemented as part of device selected from a group consisting of: a storage device, and a communication device.

12. A method for data processing, the method comprising:
applying a data decoding algorithm by a data decoder circuit to a decoder input derived from a first detected output to yield a decoded output;
identifying a potential trapping set based at least in part on the decoded output;
using a combination of the data and a filtered version of the data input to identify an unreliable location in the data input;
scaling at least one element of a data input to yield a scaled output based at least in part on the identification of the potential trapping set, wherein the at least one selected element of the data input scaled by the data instance modification circuit corresponds to the unreliable location;
leaving at least another element of the data input unmodified; and
applying a data detection algorithm by a data detector circuit to the scaled output guided by the decoded output to yield a second detector output.

13. The method of claim 12, wherein the data decoder circuit is a low density data decoder circuit.

14. The method of claim 12, wherein the data detector circuit is selected from a group consisting of: a maximum a posteriori data detector circuit, and a Viterbi algorithm data detector circuit.

15. The method of claim 12, wherein the decoded output is a first decoded output, and wherein the method further comprises:
re-applying the data decoding algorithm to the decoder input guided by the first decoded output to yield a second decoded output;
wherein identifying the potential trapping set is based at least in part on both the first decoded output and second decoded output; and
wherein applying the data detection algorithm to the scaled output guided by the decoded output to yield the second detector output includes applying the data detection algorithm to the scaled output guided by the second decoded output.

16. The method of claim 12, wherein the first decoded output exhibits a first set of unsatisfied checks and the second decoded output exhibits a second set of unsatisfied checks, and wherein the potential trapping set is identified where at least the first set of unsatisfied checks matches the second set of unsatisfied checks are identical.

17. The method of claim 16, wherein the first set of unsatisfied checks and the second set of unsatisfied checks each include fewer than five unsatisfied checks.

18. The method of claim 12, wherein the method further comprises:
identifying one or more variable nodes associated with each of the unsatisfied checks;
translating the location of the identified variable nodes from the decoder domain to the detector domain to yield a location set.

19. The method of claim 18, wherein the method further comprises:
determining a defined number of the elements of the data input identified by the location set that exhibit the lowest reliability.

20. The method of claim 19, the at least one selected element of the data input is the defined number of the elements of the data input identified by the location set and selecting the defined number of the calculated reliability values that are the lowest.

21. A storage device, the storage device comprising:
a storage medium;
a head assembly disposed in relation to the storage medium and operable to provide a sensed signal corresponding to a data set on the storage;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield a sample set;
a data detector circuit operable to apply a data detection algorithm to a the sample set to yield a first detected output;
a data decoder circuit operable to apply a data decoding algorithm to a decoder input to yield a decoded output, wherein the decoder input is derived from the first detected output;

a potential trapping set detection circuit operable to identify a potential trapping set based at least in part on the decoded output;
a data instance modification circuit operable to:
  filter the data input to yield a filtered input;
  identify an unreliable location in the data input using a combination of the data input and the filtered input;
  based at least in part on identification of the potential trapping set, scale at least one selected element of the data input corresponding to the unreliable location to yield a detector input
  leave at least another element of the data input unmodified; and
wherein the data detector circuit is further operable to apply the data detection algorithm to the detector input to yield a second detected output.

* * * * *